(12) United States Patent
Kim et al.

(10) Patent No.: US 9,502,655 B2
(45) Date of Patent: Nov. 22, 2016

(54) DISPLAY DEVICE AND METHOD FOR MANUFACTURING THE SAME

(71) Applicant: SAMSUNG DISPLAY CO., LTD., Yongin, Gyeonggi-do (KR)

(72) Inventors: Soo Youn Kim, Siheung-si (KR); Hyun Ho Kim, Hwaseong-si (KR); Seung Hun Kim, Hwaseong-si (KR); Sang Hwan Cho, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/074,134

(22) Filed: Mar. 18, 2016

(65) Prior Publication Data

US 2016/0204347 A1    Jul. 14, 2016

Related U.S. Application Data

(62) Division of application No. 14/677,933, filed on Apr. 2, 2015, now Pat. No. 9,324,766.

(30) Foreign Application Priority Data

Aug. 14, 2014 (KR) ........................ 10-2014-0105807

(51) Int. Cl.
| H01L 31/02 | (2006.01) |
| H01L 51/00 | (2006.01) |
| H01L 51/56 | (2006.01) |

(52) U.S. Cl.
CPC ........... *H01L 51/0023* (2013.01); *H01L 51/56* (2013.01)

(58) Field of Classification Search
CPC ........... H01L 27/3247; H01L 27/3246; H01L 27/3258; H01L 29/02; H01L 29/04; H01L 31/0232; H01L 31/032; H01L 51/5281
USPC ................................................ 438/142, 656
See application file for complete search history.

(56) References Cited

U.S. PATENT DOCUMENTS

| 9,324,766 B2* | 4/2016 | Kim ..................... H01L 51/5281 |
| 2005/0062409 A1 | 3/2005 | Yamazaki et al. |
| 2005/0211984 A1 | 9/2005 | Murakami et al. |
| 2006/0027804 A1 | 2/2006 | Yamazaki et al. |
| 2006/0115983 A1 | 6/2006 | Fujii et al. |
| 2007/0195236 A1 | 8/2007 | Kim et al. |
| 2008/0169750 A1 | 7/2008 | Kim et al. |

(Continued)

FOREIGN PATENT DOCUMENTS

| KR | 10-2010-0102380 A | 9/2010 |
| KR | 10-2012-0080325 A | 7/2012 |
| KR | 10-2012-0089950 A | 8/2012 |
| KR | 10-2012-0104339 A | 9/2012 |
| KR | 10-2012-0122534 A | 11/2012 |

*Primary Examiner* — Michael Lebentritt
(74) *Attorney, Agent, or Firm* — Lewis Roca Rothgerber Christie LLP

(57) ABSTRACT

A display device includes: a substrate; a pixel defining layer defining a pixel region on the substrate; a first electrode on the pixel region; a light emitting layer on the first electrode; a second electrode on the light emitting layer; a thin film encapsulation layer on the second electrode; a metal pattern on the thin film encapsulation layer and overlapping the pixel defining layer; and a multi-layer thin film layer on the metal pattern and the thin film encapsulation layer.

12 Claims, 7 Drawing Sheets

(56) References Cited

U.S. PATENT DOCUMENTS

2010/0232162 A1 9/2010 Shin et al.
2012/0168796 A1 7/2012 Moon et al.
2012/0187394 A1 7/2012 Hatano et al.
2013/0270118 A1 10/2013 Park et al.
2014/0091058 A1 4/2014 Nakagawa et al.
2015/0090971 A1 4/2015 Kim et al.

* cited by examiner

DISPLAY DEVICE AND METHOD FOR MANUFACTURING THE SAME

CROSS-REFERENCE TO RELATED APPLICATION

This application is a divisional of U.S. patent application Ser. No. 14/677,933, filed on Apr. 2, 2015, which claims priority to and the benefit of Korean Patent Application No. 10-2014-0105807, filed on Aug. 14, 2014, with the Korean Intellectual Property Office, the disclosures of which are incorporated herein in their entirety by reference.

BACKGROUND

1. Field

Aspects of some embodiments of the present invention relate to a display device, and to a method of manufacturing the display device.

2. Description of the Related Art

In general, flat panel display devices (such as a liquid crystal display device or an organic light emitting display device) includes a plurality of pairs of electrodes for generating an electric field, and an electro-optical active layer interposed therebetween. The liquid crystal display device includes a liquid crystal layer as the electro-optical active layer. An organic light emitting diode (OLED) of the organic light emitting display device includes an organic light emitting layer as the electro-optical active layer.

One of the pairs of electrodes for generating the electric field is generally connected to a switching element and receives an electric signal. The electro-optical active layer then converts the electric signal into an optical signal, thereby displaying an image.

In recent years, as the flat panel display devices are becoming light-weight and thin, there have been increasing cases where users view images using the flat panel display devices outdoors. If the user views the flat panel display devices outdoors, sunlight is reflected off the flat panel display devices, which causes deterioration in contrast and visibility.

As a result, a circular polarizer may be disposed on one surface of the flat panel display device. However, the circular polarizer may lead to an increase in the thickness of the flat panel display device, and may also require an additional process.

Accordingly, a metal dielectric thin film has been suggested, which may achieve slimness of the flat panel display device, and may also decrease the external-light reflection. However, when this metal dielectric thin film is applied, black visibility may be reduced because of such small thickness of the metal layer It is to be understood that this background section is intended to provide useful background for understanding the technology disclosed herein, and as such, the background section may include ideas, concepts, and/or recognitions that were not part of what was known or appreciated by those skilled in the pertinent art prior to a corresponding effective filing date of this application with the subject matter disclosed herein.

SUMMARY

Aspects of some embodiments of the present invention are directed toward a display device improved in contrast and visibility and capable of enhancing process efficiency, and to a method of manufacturing the display device.

Aspects of some embodiments of the present invention are directed toward a display device including a metal pattern formed on a thin film encapsulation layer overlapping a pixel defining layer.

Aspects of some embodiments of the present invention are directed toward a method of manufacturing the metal pattern employing a wet etching process using (or utilizing) a molybdenum oxide thin film, a laser, and water.

According to an embodiment of the present invention, a display device includes: a substrate; a pixel defining layer defining a pixel region on the substrate; a first electrode on the pixel region; a light emitting layer on the first electrode; a second electrode on the light emitting layer; a thin film encapsulation layer on the second electrode; a metal pattern on the thin film encapsulation layer and overlapping the pixel defining layer; and a multi-layer thin film layer on the metal pattern and the thin film encapsulation layer.

The metal pattern may include molybdenum (Mo).

The multi-layer thin film layer may include at least one dielectric layer and at least one metal layer, and the dielectric layer and the metal layer may be alternately laminated.

The dielectric layer may be on the metal pattern.

The dielectric layer may include at least one of silicon oxides ($SiO_x$, $x \geq 1$), silicon nitrides ($SiN_x$, $x \geq 1$), magnesium fluorides ($MgF_2$), calcium fluorides ($CaF_2$), aluminum oxides ($Al_2O_3$), tin oxides ($SnO_2$), indium tin oxides (ITO), indium zinc oxides (IZO), zinc oxides (ZnO), tantalum oxides ($Ta_2O_5$), niobium oxides ($Nb_2O_5$), hafnium oxides ($HfO_2$), titanium oxides ($TiO_2$), and indium oxides ($In_2O_3$).

The metal layer may include at least one of chromium (Cr), titanium (Ti), molybdenum (Mo), cobalt (Co), nickel (Ni), tungsten (W), aluminum (Al), silver (Ag), gold (Au), copper (Cu), iron (Fe), magnesium (Mg), and platinum (Pt).

The thin film encapsulation layer may include at least one organic layer and at least one inorganic layer, and the organic layer and the inorganic layer may be alternately laminated.

The display device may further include a capping layer between the thin film encapsulation layer and the second electrode.

According to an embodiment of the present invention, a method of manufacturing a display device includes: forming a thin film encapsulation layer on a substrate, the substrate including a first electrode, a pixel defining layer defining a pixel region, a light emitting layer, and a second electrode; coating a molybdenum thin film on the thin film encapsulation layer; coating a molybdenum oxide ($MoO_x$) thin film on the molybdenum thin film; radiating laser light on the molybdenum oxide thin film overlapping the pixel region and oxidizing the molybdenum thin film overlapping the pixel region; and forming a metal pattern by wet etching the oxidized molybdenum thin film and the molybdenum oxide thin film.

The forming of the metal pattern may include wet etching the oxidized molybdenum thin film and the molybdenum oxide thin film utilizing water ($H_2O$).

The oxidized molybdenum thin film may be $MoO_x$ and X may be in a range of X>2.

The method may further include forming a multi-layer thin film layer on the thin film encapsulation layer.

The forming of the multi-layer thin film layer may include alternately laminating at least one dielectric layer and at least one metal layer.

The forming of the thin film encapsulation layer may include alternately laminating at least one organic layer and at least one inorganic layer.

According to an embodiment of the present invention, a method of manufacturing a display device includes: forming a thin film encapsulation layer on a substrate, the substrate including a first electrode, a pixel defining layer defining a pixel region, a light emitting layer, and a second electrode; coating a molybdenum thin film on the thin film encapsulation layer; injecting oxygen ($O_2$) into the molybdenum thin film overlapping the pixel region by ion implantation and oxidizing the molybdenum thin film overlapping the pixel region; and forming a metal pattern by wet etching the oxidized molybdenum thin film.

The forming of the metal pattern may include wet etching the oxidized molybdenum thin film utilizing water ($H_2O$).

The oxidized molybdenum thin film may be $MoO_x$ and X may be in a range of X>2.

The method may further include forming a multi-layer thin film layer on the thin film encapsulation layer.

The forming of the multi-layer thin film layer may include alternately laminating at least one dielectric layer and at least one metal layer.

The forming of the thin film encapsulation layer may include alternately laminating at least one organic layer and at least one inorganic layer.

According to some embodiments of the present invention, a display device may include a metal pattern formed on a thin film encapsulation layer overlapping a pixel defining layer, thereby preventing or reducing external-light reflection and improving outdoor visibility.

Further, according to some embodiments of the present invention, a method of manufacturing the display device may minimize or reduce a general photolithography process, thereby improving process efficiency and preventing or reducing damages on the thin film encapsulation layer.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present invention will be more clearly understood from the following detailed description taken in conjunction with the accompanying drawings, in which.

DETAILED DESCRIPTION

Figure 1:
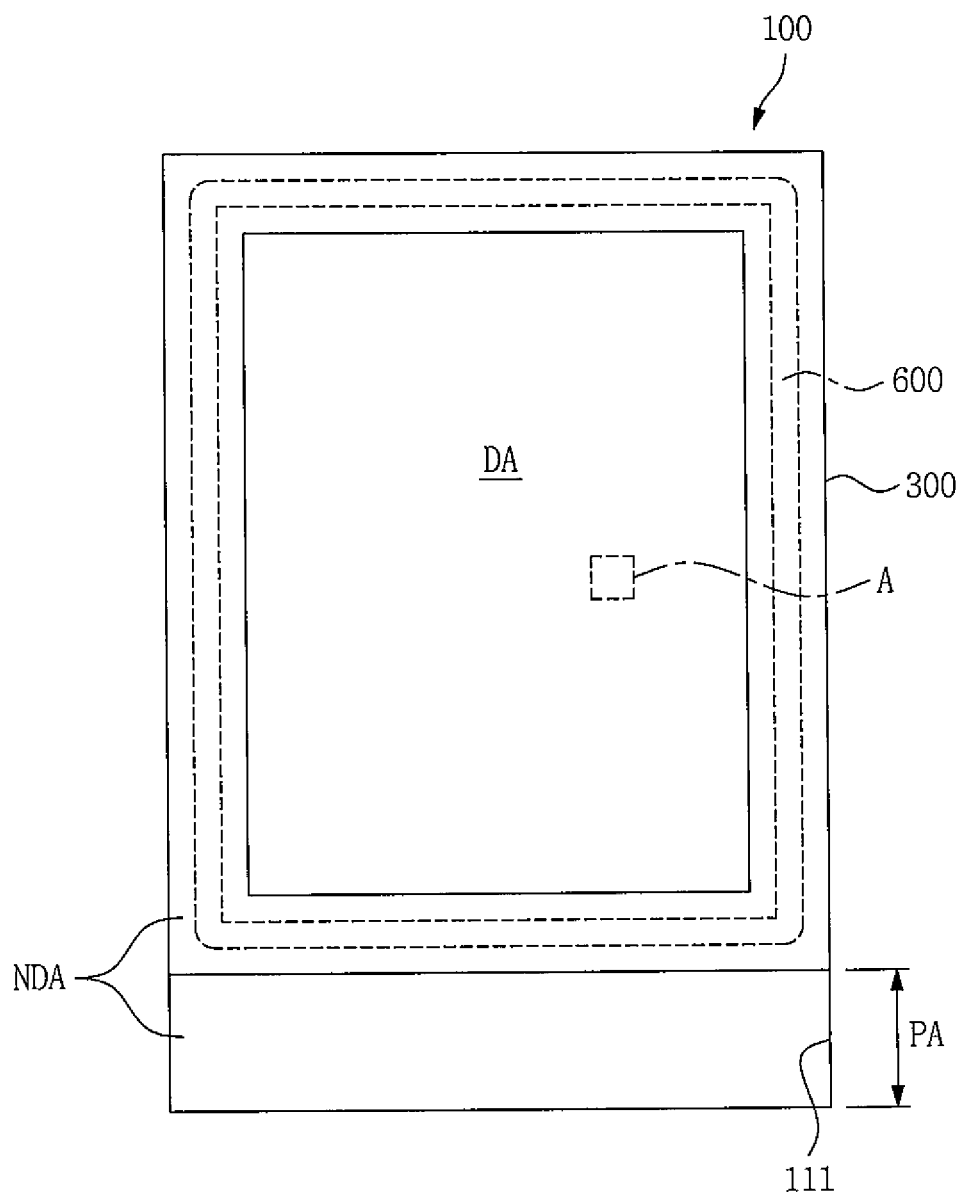
FIG. 1 is a schematic plan view illustrating a display device according to one embodiment of the present invention.

Aspects and features of the present invention and methods for achieving them will be made clear from example embodiments described below in detail with reference to the accompanying drawings. Aspects of the present invention may, however, be embodied in many different forms and should not be construed as being limited to the example embodiments set forth herein. Rather, these embodiments are provided so that this disclosure will be thorough and complete, and will fully convey the spirit and scope of the present invention to those skilled in the art. The present invention is defined by the spirit and scope of the claims, and their equivalents. Therefore, well-known constituent elements, operations, and techniques may not be described in detail in the example embodiments, in order to prevent the present invention from being obscurely interpreted. Like reference numerals refer to like elements throughout the specification.

The spatially relative terms "below", "beneath", "lower", "above", "upper", and the like, may be used herein for ease of description to describe the relationship between one element or component to another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in another direction, and thus the spatially relative terms may be interpreted differently depending on the orientations.

Throughout the specification, when an element or layer is referred to as being "connected" or "coupled" to another element or layer, the element or layer may be "directly connected" or "directly coupled" to the other element or layer, or "indirectly connected," "indirectly coupled," "electrically connected," or "electrically coupled" to the other element or layer with one or more intervening elements or layers interposed therebetween. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

The terminology used herein is for the purpose of describing particular embodiments only and is not intended to be limiting of the present invention. As used herein, the singular forms "a," "an," and "the" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." Also, the terms "use," "using," and "used" may be considered synonymous with the terms "utilize," "utilizing," and "utilized," respectively.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and should not be interpreted in an ideal or excessively formal sense, unless clearly defined in the present specification.

Hereinafter, a display device according to one embodiment of the present invention will be described in more detail with reference to FIGS. 1 to 3. The display device according to one embodiment of the present invention may be an organic light emitting display device or a liquid crystal display device. Hereinafter, for ease of description, it is assumed that the organic light emitting display device is used as the display device according to some embodiments of the present invention.

FIG. 1 is a schematic plan view illustrating a display device according to one embodiment of the present invention. FIG. 2 is a plan view of an enlarged area A shown in FIG. 1. FIG. 3 is a cross-sectional view taken along the line A-A' shown in FIG. 2.

Referring to FIG. 1, the organic light emitting display device 100 according to one embodiment of the present invention may include a substrate 111, a thin film encapsulation layer 300, and a sealing member 600. However, the present invention is not limited thereto. For example, the substrate 111 may be sealed by a sealing substrate and the like, instead of the thin film encapsulation layer 300.

The substrate 111 may have a display area DA where an image is displayed by light emission, and a non-display area NDA outside of the display area DA. An organic light emitting diode (OLED), and a thin film transistor and wirings for driving the OLED are formed on the display area DA. The non-display area NDA may include a pad area PA, on which a plurality of pad electrodes are formed, to receive an external signal for the OLED to perform light emission, and to supply the signal to the OLED.

Hereinafter the display area DA according to one embodiment of the present invention will be described with reference to FIGS. 2 and 3.

Figure 2:
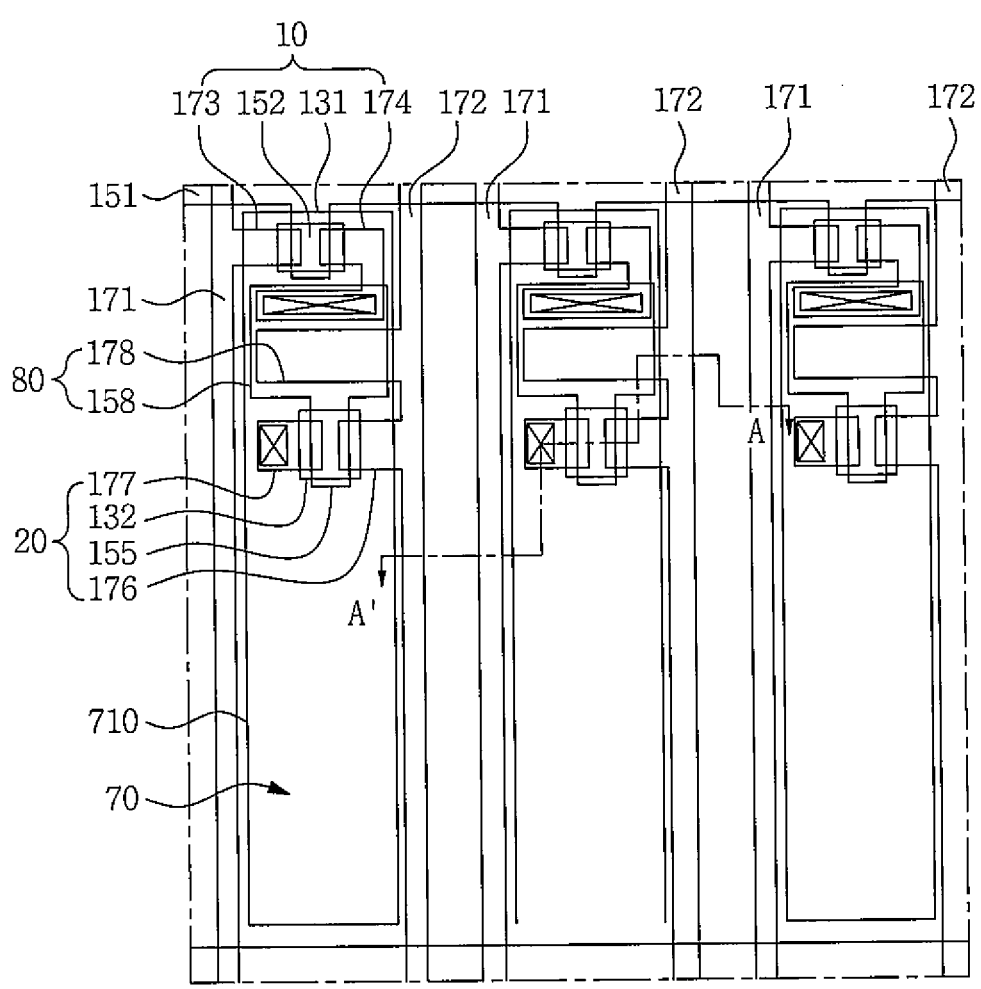
FIG. 2 is a plan view of an enlarged area A shown in FIG. 1.
Figure 3:
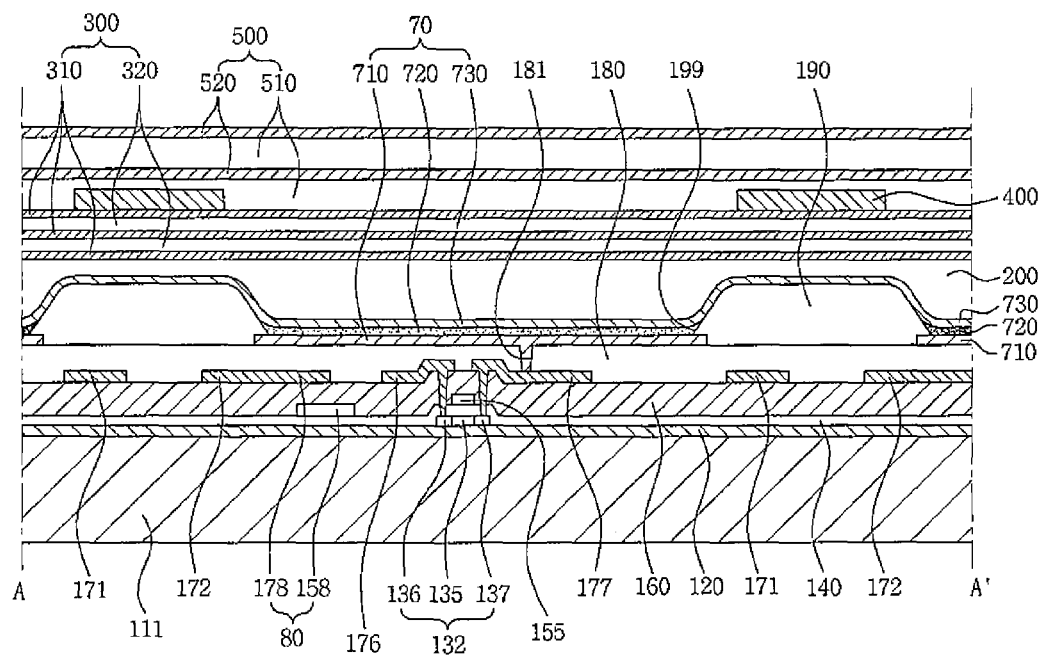
FIG. 3 is a cross-sectional view taken along the line A-A' shown in FIG. 2.

Although FIGS. 2 and 3 illustrate an active-matrix (AM) organic light emitting (e.g., AMOLED) display device having a 2Tr-1Cap (e.g., two transistor and one capacitor) structure, which includes two thin film transistors (TFTs) 10 and 20 and a capacitor 80 for one pixel of the display area (reference sign DA of FIG. 1, hereinafter the same), the present invention is not limited thereto.

In some embodiments, the organic light emitting display device may have various different structures including three or more TFTs and two or more capacitors for one pixel, and may further include additional lines. As used herein, the term "pixel" refers to the smallest unit for emitting light to display an image, and the display area displays an image using a plurality of pixels.

The organic light emitting display device 100 according to one embodiment of the present invention includes a substrate 111, and a plurality of pixels on the substrate 111 (e.g., defined on the substrate 111). Each of the plurality of pixels may include a switching TFT 10, a driving TFT 20, the capacitor 80, and an OLED 70. In addition, the substrate 111 includes a gate line 151 extending in one direction, and a data line 171 and a common power line 172 that are both insulated from and crossing the gate line 151.

Herein, the pixel may be generally located between (e.g., defined by) the gate line 151, the data line 171, and the common power line 172, but the present invention is not limited thereto.

The OLED 70 may include a first electrode 710, an organic light emitting layer 720 formed on the first electrode 710, and a second electrode 730 formed on the organic light emitting layer 720. Herein, one or more first electrodes 710 are formed for each pixel, and thus, the substrate 111 may include a plurality of first electrodes 710 that are spaced apart from each other.

Herein, the first electrode 710 may be a positive end portion (e.g., anode) serving as a hole injecting electrode, and the second electrode 730 may be a negative end portion (e.g., cathode) serving as an electron injecting electrode. However, the present invention is not limited thereto, and thus, the first electrode 710 may function as a cathode, and the second electrode 730 may function as an anode according to a method of driving the organic light emitting display device. Further, the first electrode 710 may be a pixel electrode, and the second electrode 730 may be a common electrode.

In the OLED, holes and electrons that are injected to the light emitting layer 720 are combined with each other to form excitons, and the OLED emits light by energy generated when the excitons fall from an excited state to a ground state.

The capacitor 80 may include a pair of storage electrodes 158 and 178, with an interlayer insulating layer 160 interposed therebetween. Herein, the interlayer insulating layer 160 may include a dielectric material. A capacitance of the capacitor 80 may be determined by electric charges stored in the capacitor 80, and a voltage across the pair of storage electrodes 158 and 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177.

The switching TFT 10 may function as a switching device that selects the pixel to perform light emission. The switching gate electrode 152 may be coupled (e.g., connected) to the gate line 151, and the switching source electrode 173 may be coupled to the data line 171. The switching drain electrode 174 may be spaced apart from the switching source electrode 173, and may be coupled to the first storage electrode 158.

The driving TFT 20 may apply a driving power to the first electrode 710, which allows the light emitting layer 720 of the OLED 70 in the selected pixel to emit light. The driving gate electrode 155 may be coupled to the first storage electrode 158 that is coupled to the switching drain electrode 174. The driving source electrode 176 and the second storage electrode 178 may be respectively coupled to the common power line 172.

The driving drain electrode 177 may be coupled to the first electrode 710 of the OLED 70 through a drain contact hole 181.

With the above-described structure, the switching TFT 10 may be operated (e.g., turned on or off) by a gate voltage applied to the gate line 151, and may transmit a data voltage applied to the data line 171 to the driving TFT 20.

Voltage (that is equivalent to a difference between a common voltage applied from the common power line 172 to the driving TFT 20 and the data voltage transmitted from the switching TFT 10) may be stored in the capacitor 80, and current corresponding to the voltage stored in the capacitor 80 may flow to the OLED 70 via the driving TFT 20, so that the OLED 70 may emit light.

A structure of the organic light emitting display device 100 according to one embodiment will be described in more detail with reference to FIGS. 2 and 3.

The OLED 70, the driving TFT 20, the capacitor 80, the data line 171, and the common power line 172 illustrated in FIG. 3 will be mainly described. Further, the switching semiconductor layer 131, the switching gate electrode 152, and the switching source and drain electrodes 173 and 174 of the switching TFT 10 may have the same or substantially the same laminated structure as that of the driving semiconductor layer 132, the driving gate electrode 155, and the driving source and drain electrodes 176 and 177 of the driving TFT 20, respectively, and thus, repeated description thereof will not be provided.

According to one embodiment of the present invention, the substrate 111 may include (e.g., formed of) an insulating substrate including glass, quartz, ceramic, plastic, and the like. However, the present invention is not limited thereto, for example, the substrate 111 may include a metal first substrate including stainless steel and the like.

A buffer layer 120 may be disposed on the substrate 111. The buffer layer 120 may reduce or prevent infiltration of undesirable elements and planarize a surface, and may include various suitable materials in accordance therewith. For example, the buffer layer 120 may include at least one selected from the group of silicon nitrides ($SiN_x$), silicon oxides ($SiO_2$), and silicon oxynitrides ($SiO_xN_y$). However, the buffer layer 120 may not be necessary, and thus, may be omitted according to the kind of the substrate 111 and process conditions thereof.

The driving semiconductor layer 132 may be disposed on the buffer layer 120. The driving semiconductor layer 132 may include at least one semiconductor material selected from the group of polycrystalline silicon, amorphous silicon, and oxide semiconductors. Further, the driving semiconductor layer 132 may have a channel region 135 that is not doped with impurities, and p+ doped source and drain regions 136 and 137 that are formed on both sides of the channel region 135, respectively. In this case, p-type impurities, such as boron B for example, may be used as dopant ions and $B_2H_6$ is generally used. However, the present invention is not limited thereto, and such impurities may vary depending on the kinds of the TFTs.

A gate insulating layer 140 including a silicon nitride or a silicon oxide is disposed on the driving semiconductor layer 132. The gate insulating layer 140 may include at least one of tetraethylorthosilicate (TEOS), silicon nitrides ($SiN_x$), and silicon oxides ($SiO_2$). For example, the gate insulating layer 140 may have a double-layer structure where a $SiN_x$ layer having a thickness of 40 nm and a TEOS layer having a thickness of 80 nm are sequentially laminated. However, the gate insulating layer 140 according to some embodiments of the present invention is not limited thereto.

A driving gate electrode 155, a gate line (reference number 151 of FIG. 2), and a first storage electrode 158 are formed on the gate insulating layer 140. In this case, the driving gate electrode 155 is disposed to overlap at least a portion of the driving semiconductor layer 132, that is, in more detail, corresponding to the channel region 135. The driving gate electrode 155 may prevent or reduce the channel region 135 from being doped with impurities, when the drain and source regions 136 and 137 of the driving semiconductor layer 132 are doped with the impurities in the process of forming the driving semiconductor layer 132.

The gate electrode 155 and the first storage electrode 158 may be disposed on the same layer, and may include substantially the same metal material. In this case, the metal material may include at least one selected from the group of molybdenum (Mo), chromium (Cr), and tungsten (W). For example, the gate electrode 155 and the first storage electrode 158 may include molybdenum (Mo) or molybdenum alloys.

An insulating layer 160 (e.g., interlayer insulating layer) covering the driving gate electrode 155 is disposed on the gate insulating layer 140. The insulating layer 160 may be an interlayer insulating layer. The insulating layer 160 may include a silicon nitride ($SiN_x$) or a silicon oxide ($SiO_x$) like the gate insulating layer 140. The gate insulating layer 140 and the insulating layer 160 have contact holes to expose the source and drain regions 136 and 137 of the driving semiconductor layer 132.

The driving source electrode 176, the driving drain electrode 177, the data line 171, the common power line 172, and the second storage electrode 178 may be disposed on the insulating layer 160 at the display area DA. The driving source electrode 176 and the driving drain electrode 177 may be respectively coupled (e.g., connected) to the source and drain regions 136 and 137 of the driving semiconductor layer 132 through the contact holes.

In more detail, the driving source electrode 176, the driving drain electrode 177, the data line 171, the common power line 172, and the second storage electrode 178 may be formed of a refractory metal including at least one selected from a group of molybdenum, chromium, tantalum, and titanium, or including at least one metal alloys thereof, and may have a multi-layer structure including a refractory metal film and a low-resistance conductive film. Examples of the multi-layer structure include: a double-layer structure including a chromium or molybdenum (alloy) lower film and an aluminum (alloy) upper film; and a triple-layer structure including a molybdenum (alloy) lower film, an aluminum (alloy) intermediate film, and a molybdenum (alloy) upper film.

However, the present invention is not limited thereto, and the driving source electrode 176, the driving drain electrode 177, the data line 171, the common power line 172, and the second storage electrode 178 may be formed of various conductive materials other than the above-described materials.

Accordingly, the driving thin film transistor 20 may be formed including the driving semiconductor layer 132, the driving gate electrode 155, the driving source electrode 176, and the driving drain electrode 177. However, the configuration of the driving thin film transistor 20 is not limited thereto, and thus, may be formed to have various different structures.

A protective layer 180 covering the driving source electrode 176, the driving drain electrode 177, and the like, is disposed on the insulating layer 160. The protective layer 180 may include organic materials, such as polyacrylates or polyimides. The protective layer 180 may be a planarizing layer.

The protective layer 180 may be formed of at least one selected from a group of polyacrylate resins, epoxy resins, phenolic resins, polyamide resins, polyimide reins, unsaturated polyester resins, poly-phenylenether resins, poly-phenylenesulfide resins, and benzocyclobutene (BCB).

The protective layer 180 has a drain contact hole 181 for exposing the driving drain electrode 177.

The first electrode 710 is formed on the protective layer 180, and the first electrode 710 is coupled to the driving drain electrode 177 through the drain contact hole 181 formed on the protective layer 180.

A pixel defining layer 190 is formed on the protective layer 180 and covers the first electrode 710. The pixel defining layer 190 has an opening 199 for exposing the first electrode 710.

That is, the first electrode 710 is disposed to correspond to the opening 199 of the pixel defining layer 190. The pixel defining layer 190 may include resins, such as polyacrylate resins or polyimide resins.

Further, the pixel defining layer 190 may include a photosensitive organic material or a photosensitive polymer material. For example, the pixel defining layer 190 may include one of polyacrylates, polyimides, photo sensitive polyimides (PSPI), photosensitive acryl (PA), and photosensitive novolak resins.

The organic light emitting layer 720 is formed on the first electrode 710 in the opening 199 of the pixel defining layer 190, and the second electrode 730 is formed on the pixel defining layer 190 and the organic light emitting layer 720.

Accordingly, the OLED 70 is formed to include the first electrode 710, the organic light emitting layer 720, and the second electrode 730.

One of the first and second electrodes 710 and 730 is formed of a transparent conductive material, and the other one thereof is formed of a transflective or reflective conductive material. Depending on the material for forming the first and second electrodes 710 and 730, the organic light emitting display device 100 may be a top-emission display device, a bottom-emission display device, or a both-side-emission (e.g., dual-emission) display device.

At least one selected from the group of indium tin oxides (ITO), indium zinc oxides (IZO), zinc oxides (ZnO), and indium oxides ($In_2O_3$) may be used as the transparent conductive material. At least one selected from the group of lithium (Li), calcium (Ca), lithium fluoride/calcium (LiF/Ca), lithium fluoride/aluminum (LiF/Al), aluminum (Al), silver (Ag), magnesium (Mg), or gold (Au) may be used as the reflective material.

The organic light emitting layer 720 may include low molecular weight organic materials or high molecular weight organic materials. The organic light emitting layer 720 may have a multi-layer structure including a light emitting layer and at least one of a hole injection layer (HIL), a hole transporting layer (HTL), an electron transporting layer (ETL), and an electron injection layer (EIL). For example, the HIL may be disposed on the first electrode 710 that is a positive end portion; and the HTL, light emitting layer, ETL, and EIL may be sequentially laminated thereon.

According to some embodiments of the present invention, the organic light emitting layer 720 is only formed inside the opening 199 of the pixel defining layer 190, but the present invention is not limited thereto. For example, at least one layer of the organic light emitting layer 720 may not only be disposed on the first electrode 710 inside the opening 199 of the pixel defining layer 190, but may also be disposed between the pixel defining layer 190 and the second electrode 730. In more detail, HIL, HTL, ETL, EIL, and the like of the organic light emitting layer 720 may be formed on a position other than the opening 199 by the open mask, and the light emitting layer of the organic light emitting layer 720 may be formed on each opening 199 by the fine metal mask FMM.

In a case where the LCD display is used according to some embodiments of the present invention, the first electrode 710 is physically and electrically coupled (e.g., physically and electrically connected) to the driving drain electrode 177 through the drain contact hole 181, and is applied with a data voltage from the driving drain electrode 177. The first electrode 710, which is applied with the data voltage, forms an electric field with the second electrode (e.g., common electrode), which is applied with a common voltage, to determine (e.g., control) an arrangement of the liquid crystal molecules of the liquid crystal layer between the two electrodes. The first electrode 710 and the second electrode form a capacitor (hereinafter "a liquid crystal capacitor"), which maintains an applied voltage even when the thin film transistor is turned off.

Referring back to FIG. 3, a capping layer 200 may be disposed on the second electrode 730 in order to protect the OLED 70, before the thin film encapsulation layer 300 is formed thereon, to prevent the OLED 70 from being damaged during the forming of the thin film encapsulation layer 300. However, the present invention is not limited thereto, and the capping layer 200 may be omitted and an organic layer 320 of the thin film encapsulation layer 300 may be disposed on the second electrode 730 instead of the capping layer 200.

The capping layer 200 may include an ultraviolet (UV)-blocking layer configured to block UV rays that may exert adverse effects on the OLED 70. For example, the UV rays may be radiated so as to form the organic layer 320 during the forming of the thin film encapsulation layer 300. In this case, the capping layer 200 having a UV-blocking property may be formed in order to prevent or reduce damage to the OLED 70.

The capping layer 200 may have a single-layer structure, or may have a multi-layer structure having two or more layers. The capping layer 200 may also have properties of preventing or reducing infiltration of moisture or oxygen.

The thin film encapsulation layer 300 may be formed on the capping layer 200. However, the present invention is not limited thereto, and the thin film encapsulation layer 300 may be directly formed on the OLED 70 to encapsulate the driving circuit and the OLED 70.

The thin film encapsulation layer 300 may have a structure including two or more inorganic layers 310 and two or more organic layers 320. Herein, the inorganic layers 310 and the organic layers 320 are alternately laminated. FIG. 3 illustrates that three inorganic layers 310 and two organic layers 320 are alternately laminated to form the thin film encapsulation layer 300, but the number of the inorganic layers 310 and the organic layers 320 are not limited thereto.

The inorganic layer 310 may include at least one of aluminum oxides ($Al_2O_3$) or silicon oxides ($SiO_2$). The organic layer 320 may include at least one of epoxy, acrylates, and urethane acrylates. The inorganic layer 310 is configured to prevent or reduce the infiltration of moisture and oxygen into the display area, and the organic layer 320 is configured to reduce internal stress of the inorganic layer 310 and/or to fill micro-cracks and pinholes of the inorganic layer 310.

A multi-layer thin film layer 500 for preventing or reducing external light reflection may be formed on the thin film encapsulation layer 300. The multi-layer thin film layer 500 may include a metal dielectric thin film. The multi-layer thin film layer 500 may be formed of two or more dielectric layers 510 and two or more metal layers 520. The dielectric layers 510 and the metal layers 520 are alternately laminated.

The multi-layer thin film layer 500 may reduce the external light reflection using optical destructive interference and light absorption caused by the metal layer 520. Therefore, according to some embodiments of the present invention, the display device may reduce the external light reflection without an additional circular polarizer. As used herein, the optical destructive interference refers to a phenomenon where waves of light rays reflected off the interface cancel each other out when they have a phase difference of about 180 degrees and have equal reflection amplitude.

However, it is difficult to cause the optical destructive interference within the whole wavelength range. Thus, a part of light may not undergo the destructive interference and may not be completely cancelled out. It is desirable to absorb the remaining light using an absorbing member. Metal is a material that can absorb light. Thus, when light passes through a metal material, a part of the light may be absorbed. Accordingly, the metal layer 520 may play a role in inducing the destructive interference of the reflected light, and also absorbing the external light that is not cancelled out by the destructive interference when passing through the metal layer 520.

For example, by adjusting the thickness of the dielectric layer 510, the external light reflected off the metal layer 520 disposed at a lower part undergoes the destructive interference with the light reflected off the metal layer 520 disposed at an upper part. Further, the light that is not subject to the destructive interference is absorbed at the metal layer 520 disposed at the upper part. That is, the metal layer 520 disposed at the upper part absorbs the external light that is not cancelled out by the destructive interference.

The dielectric layer 510 is configured to adjust a relative phase to become about 180 degrees between the light reflected off the metal layer 520 at the lower part and the light reflected off the metal layer 520 at the upper part. For example, the dielectric material may have a lower refractive index in accordance with an increase in the wavelength, which may make it difficult to maintain the optical destructive interference within the whole wavelength range. Therefore, it may be desirable to use the dielectric material having a less variable refractive index in accordance with a change in wavelength.

For this purpose, the dielectric layer 510 may include at least one of silicon oxides ($SiO_x$, $x \geq 1$), silicon nitrides ($SiN_x$, $x \geq 1$), magnesium fluorides ($MgF_2$), calcium fluorides ($CaF_2$), aluminum oxides ($Al_2O_3$), tin oxides ($SnO_2$), indium tin oxides (ITO), indium zinc oxides (IZO), zinc oxides (ZnO), tantalum oxides ($Ta_2O_5$), niobium oxides ($Nb_2O_5$), hafnium oxides ($HfO_2$), titanium oxides ($TiO_2$), and indium oxides ($In_2O_3$).

The metal layer 520 may include at least one of chromium (Cr), titanium (Ti), molybdenum (Mo), cobalt (Co), nickel (Ni), tungsten (W), aluminum (Al), silver (Ag), gold (Au), copper (Cu), iron (Fe), magnesium (Mg), and platinum (Pt). If the metal layer 520 includes such metal material, the metal layer 520 may efficiently absorb light or may reflect the external light within the whole or substantially whole visible light wavelength range.

In a case where the multi-layer thin film layer 500 is formed on the thin film encapsulation layer 300 as described above, the display device may be slimmer, when compared to the case of using the circular polarizer, but may cause a drawback of low contrast (e.g., the black visibility).

Therefore, the organic light emitting display device 100 according to some embodiments of the present invention includes a metal pattern 400 overlapping the pixel defining layer 190 and disposed on the thin film encapsulation layer 300.

The metal pattern 400 is formed on the pixel defining layer 190 that corresponds to the non-light emission area. The metal pattern 400 is configured to prevent or reduce the external light from being incident on the thin film TFTs 10 and 20. The metal pattern 400 absorbs the external light in the non-light emission area, thereby increasing black visibility (e.g. contrast). As a result, the organic light emitting display device 100 according to some embodiments of the present invention may reduce external light reflection and also improve the contrast by including the multi-layer thin film layer 500 and the metal pattern 400.

The metal pattern 400 may include metal having a high absorption rate. For example, the metal pattern 400 may include molybdenum (Mo). The reason why the metal pattern 400 may include molybdenum (Mo) will be described below.

The dielectric layer 510 is formed on the metal pattern 400. That is, the metal pattern 400 is formed on the thin film encapsulation layer 300, and the multi-layer thin film layer 500 is formed on the metal pattern 400 and the thin film encapsulation layer 300.

The metal pattern 400 is generally formed by a photolithography process. The photolithography process includes a wet etching process of the photosensitive metal material using a developing solution and soft-bake and hard-bake processes, wherein the photosensitive metal material is cured. When subject to the wet etching process or the bake process, the thin film encapsulation layer 300 may be damaged. The damaged thin film encapsulation layer 300 may cause shortening of the life of the inside OLED 70.

Therefore, a process of forming the metal pattern 400 may be desired in which the photolithography process may be reduced without damaging the thin film encapsulation layer 300.

A method of manufacturing the organic light emitting display device 100 according to one embodiment employs a laser radiation process and a wet etching process using water in order to form the metal pattern 400.

Hereinafter, a method of manufacturing the metal pattern will be described with reference to FIGS. 4A to 4F.

FIGS. 4A to 4F are cross-sectional views illustrating a method of manufacturing the display device according to one embodiment of the present invention.

Figure 4A:
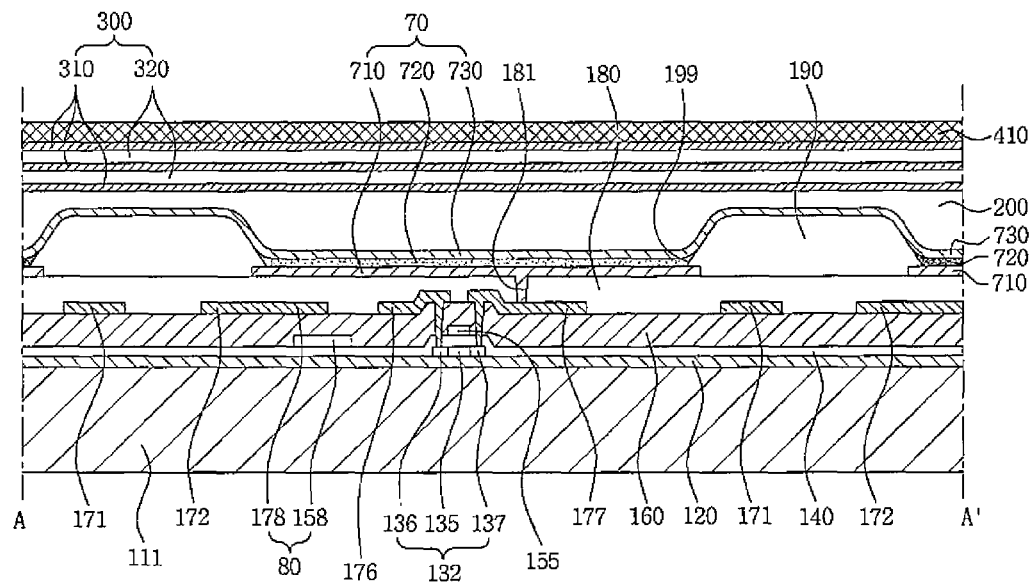
FIGS. 4A to 4F are cross-sectional views illustrating a method of manufacturing a display device according to one embodiment of the present invention.

Referring to FIG. 4A, a first electrode 710 is formed on a substrate 111. A pixel defining layer 190 for defining a pixel region is formed on the substrate 111. A light emitting layer 720 is formed on the first electrode 710. A second electrode 730 is formed on the light emitting layer 720. A thin film encapsulation layer 300 is formed on the second electrode 730. Processes of forming the first electrode 710, the pixel defining layer 190, the light emitting layer 720, the second electrode 730, and the thin film encapsulation layer 300 may employ methods known to those skilled in the pertinent art.

A molybdenum (Mo) thin film 410 is coated on an inorganic layer 310 of the thin film encapsulation layer 300. The molybdenum thin film 410 may be deposited in a sputtering method using a sputter.

Figure 4B:
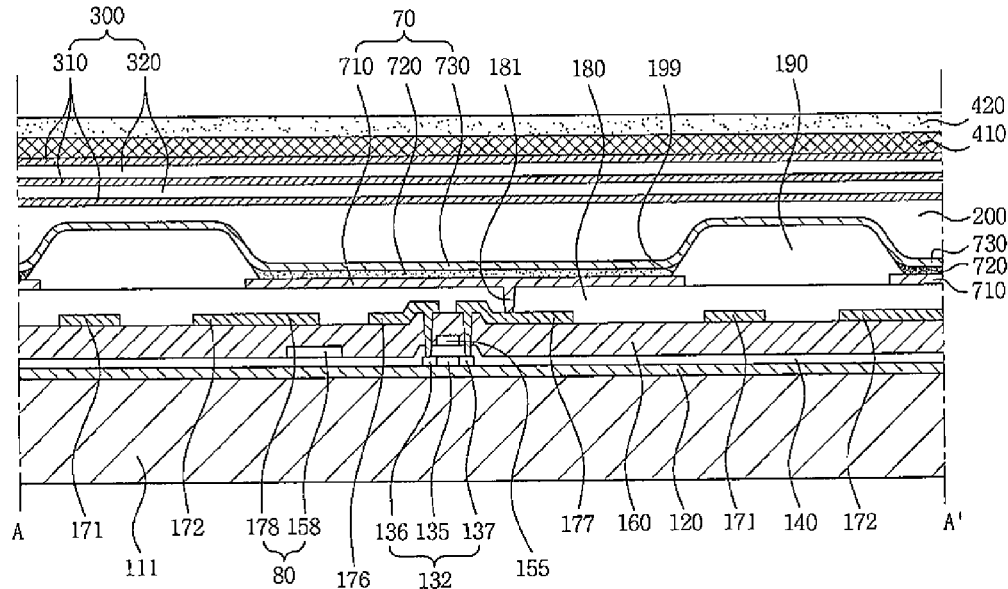

Referring to FIG. 4B, a molybdenum oxide ($MoO_x$) thin film 420 is coated on the molybdenum thin film 410. The molybdenum oxide thin film 420 may be deposited in a sputtering method using an $O_2$ reactive sputter, wherein oxygen $O_2$ gas is injected. An oxidation number of the molybdenum oxide thin film 420 is larger than 2. In other words, the molybdenum oxide thin film 420 is $MoO_x$ and X is in a range of X>2. That is because $MoO_2$ is insoluble in water, whereas the molybdenum oxide of which X is larger than 2 is soluble in water. For example, $MoO_3$ is soluble in water. The method of manufacturing the display device according to some embodiments of the present invention uses water for the etching process, and thus, the oxidation number of the molybdenum oxide thin film 420 is larger than 2.

Figure 4C:
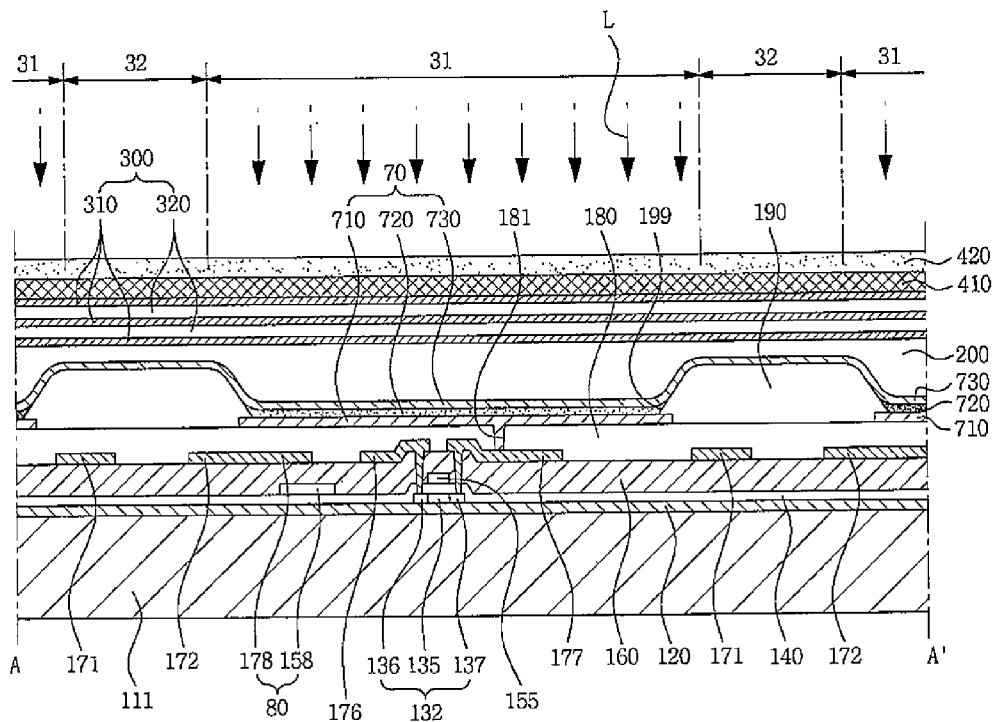

Referring to FIG. 4C, an oxygen diffusion process is performed. Only a laser irradiation area 31 is irradiated with laser light, whereas a non-laser irradiation area 32 is not irradiated with laser light. The laser irradiation area 31 is a light emission area, and the metal pattern 400 is not formed thereon. The non-laser irradiation area 32 is a non-light emission area, and the metal pattern 400 is formed thereon. In a case where the molybdenum oxide thin film 420 is irradiated with the laser light, the oxygen included in the molybdenum oxide thin film 420 may diffuse through the molybdenum thin film 410 disposed at the lower part.

Figure 4D:
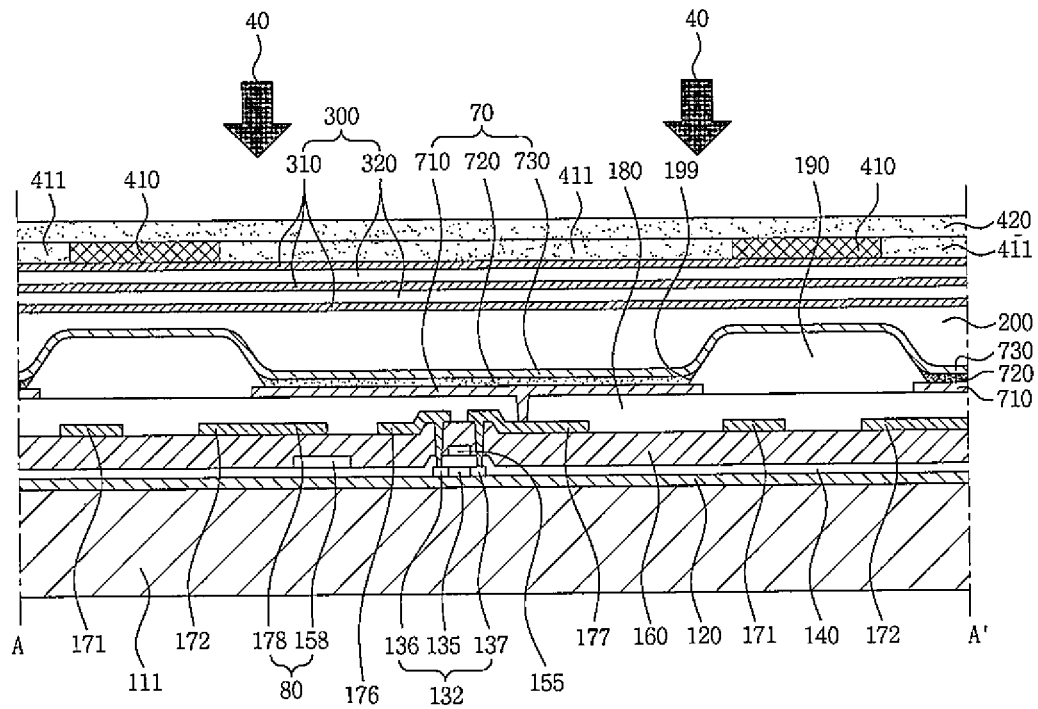

Referring to FIG. 4D, the wet etching process is performed using water ($H_2O$). A part of the molybdenum thin film 410 where the oxygen diffusion takes place becomes an oxidized molybdenum thin film 411. The oxidized molybdenum thin film 411 may overlap the light emission area, and the molybdenum thin film 410 where the oxygen diffusion does not take place may overlap the pixel defining layer 190. The molybdenum oxide thin film 420 and the oxidized molybdenum thin film 411 may undergo the wet etching process using water $H_2O$ 40. That is, the characteristic of the molybdenum oxide that is soluble in water when the oxidation number is larger than 2 is used to perform the wet etching process of the molybdenum oxide thin film 420 and the oxidized molybdenum thin film 411.

Figure 4E:
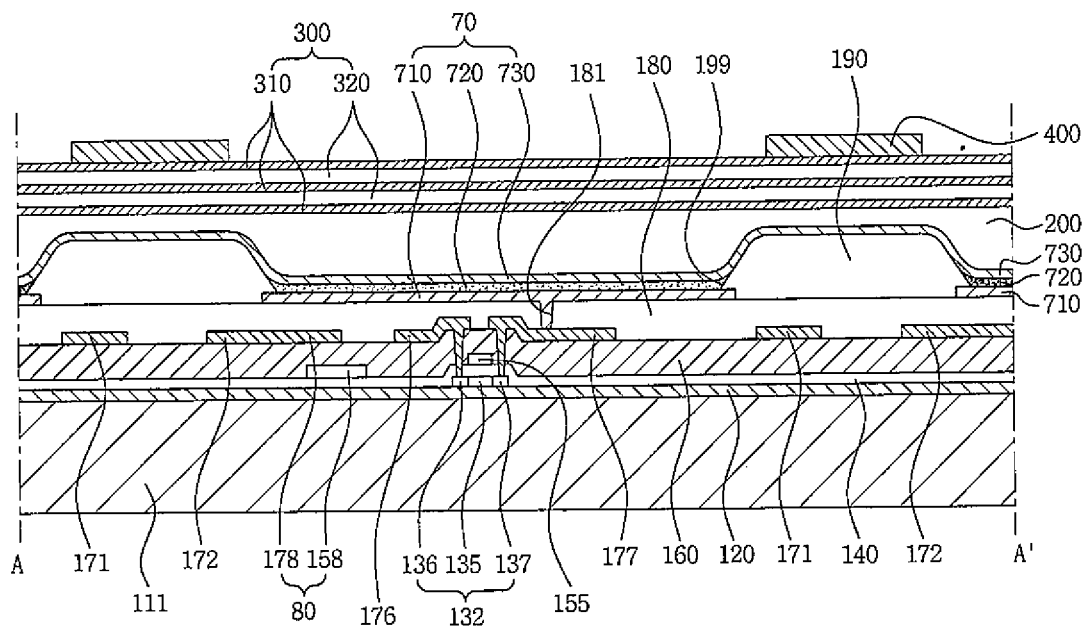

Referring to FIG. 4E, the metal pattern 400 is formed as the molybdenum oxide thin film 420 and the oxidized molybdenum thin film 411 are etched. The metal pattern 400 may be formed on an area overlapping the pixel defining layer 190.

Figure 4F:
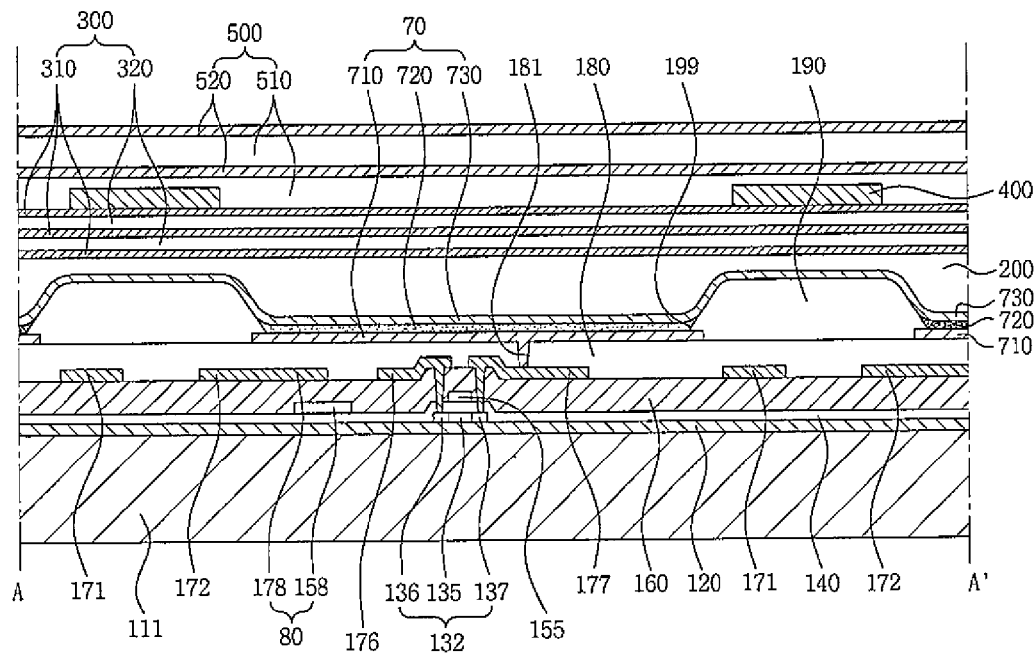

Referring to FIG. 4F, a multi-layer thin film layer 500 is formed on the metal pattern 400 and the thin film encapsulation layer 300. A process of forming the multi-layer thin film layer 500 may employ the same or substantially the same method for forming the thin film encapsulation layer 300.

If the metal pattern 400 is formed as described above, the thin film encapsulation layer 300 may be protected from damages. That is, in contrast to the conventional photolithography process, damages on the thin film encapsulation layer 300 may be prevented or reduced as a developing solution containing chemical substances is not used.

Further, the related art etching, developing, and baking processes using the chemical substances may be omitted and simplified by the oxygen diffusion process and the wet etching process using water as described above. Therefore, the method of manufacturing the metal pattern according to some embodiments of the present invention may improve process efficiency.

Hereinafter, a method of manufacturing a metal pattern 400 according to another embodiment of the present invention will be described with reference to FIGS. 5A to 5C. The manufacturing processes that are the same or substantially the same as the method of manufacturing the metal pattern 400 as described above according to some embodiments of the present invention will not be repeated.

Figure 5A:
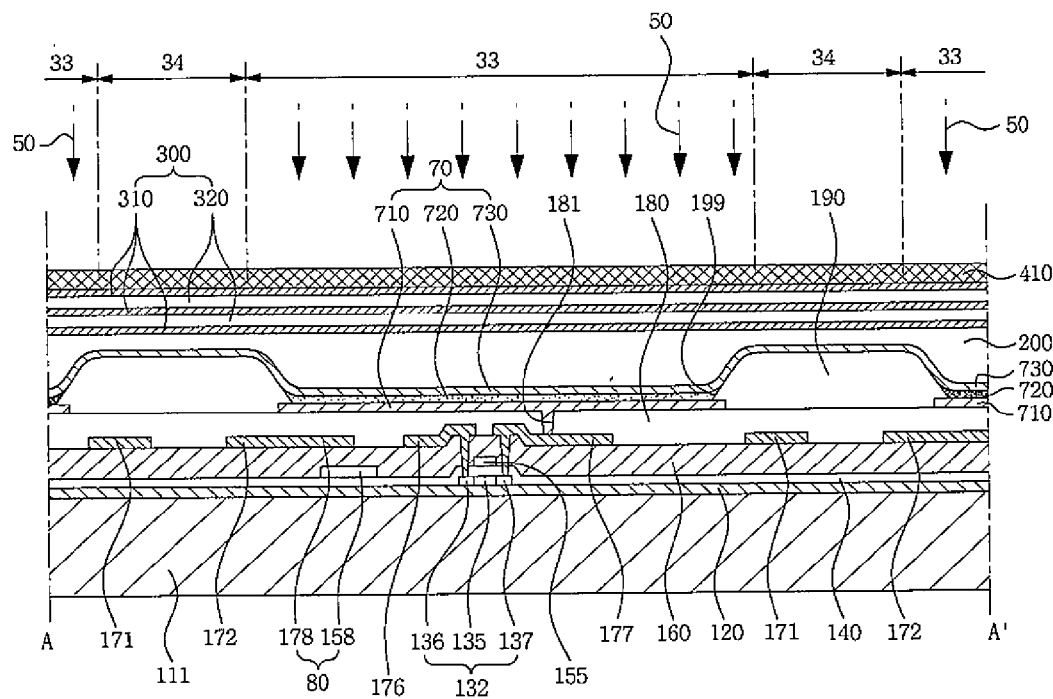
FIGS. 5A to 5C are cross-sectional views illustrating a method of manufacturing a display device according to another embodiment of the present invention.
Figure 5B:
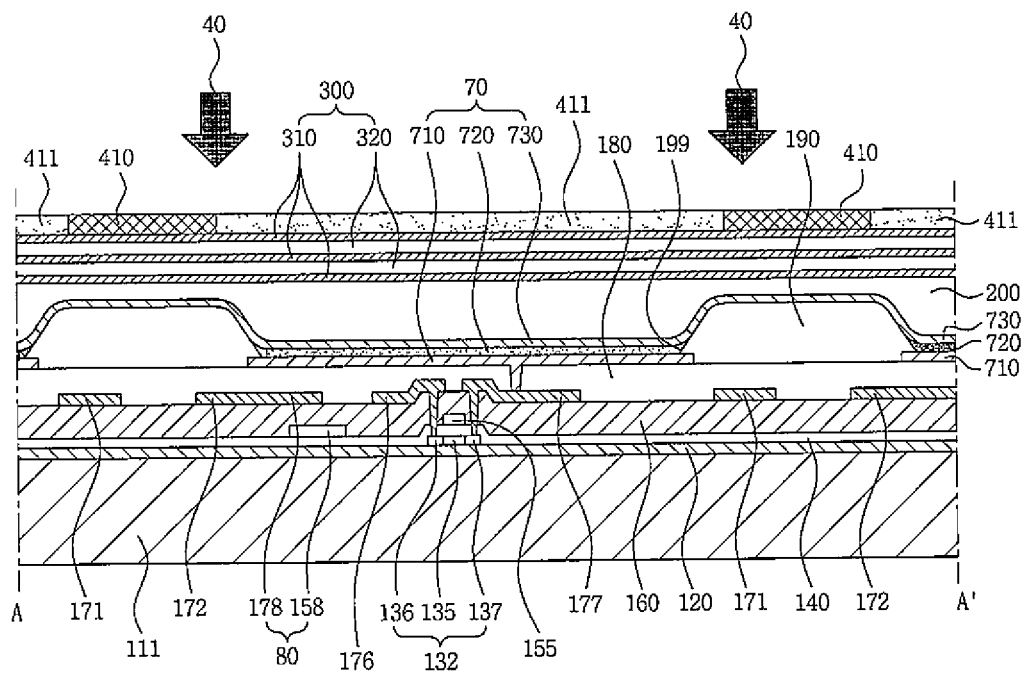
Figure 5C:
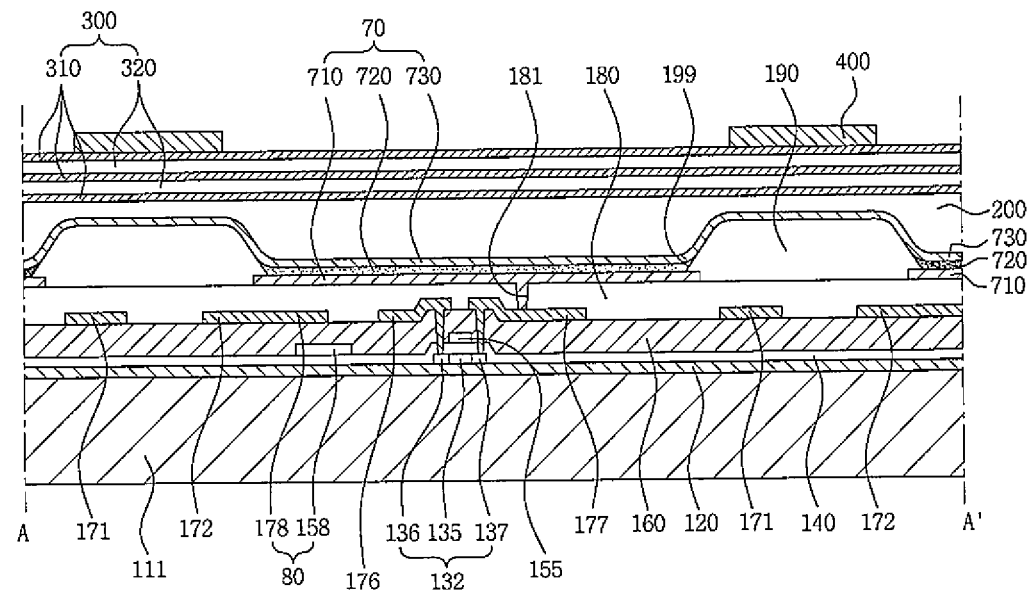

FIGS. 5A to 5C are cross-sectional views illustrating a method of manufacturing a display device according to another embodiment of the present invention.

Referring to FIG. 5A, an oxygen diffusion process is performed. Processes of forming a first electrode 710, a pixel defining layer 190, a light emitting layer 720, a second electrode 730, a thin film encapsulation layer 300, and a molybdenum thin film 410 may employ the same or substantially the same manufacturing method as described above according to some embodiments of the present invention. After forming the molybdenum thin film 410, oxygen 50 is injected into an ion implantation area 33 by ion implantation. That is, the oxygen 50 is injected into an area of the molybdenum thin film 410 corresponding to the ion implantation area 33 by ion implantation, instead of separately forming the molybdenum oxide thin film. The ion implantation area 33 corresponds to the light emission area. Further, a non-ion injection area 34 corresponds to the non-light emission area and overlaps the pixel defining layer 190.

Referring to FIG. 5B, the part of the molybdenum thin film corresponding to the area where the oxygen is injected is oxidized to become an oxidized molybdenum thin film 411. The molybdenum thin film 410 and the oxidized molybdenum thin film 411 are etched by a wet etching process using water 40.

Referring to FIG. 5C, the oxidized molybdenum thin film 411 is etched by water to form the metal pattern 400.

Accordingly, the method of manufacturing the metal pattern 400 according to another embodiment of the present invention may improve process efficiency without damaging the thin film encapsulation layer.

From the foregoing, it will be appreciated that various embodiments in accordance with the present disclosure have been described herein for purposes of illustration, and that various modifications may be made without departing from the spirt and scope of the present invention. Accordingly, the various embodiments disclosed herein are not intended to be limiting of the true spirit and scope of the present invention, as defined in the appended claims, and their equivalents.

What is claimed is:

1. A method of manufacturing a display device, the method comprising:
   forming a thin film encapsulation layer on a substrate, the substrate comprising a first electrode, a pixel defining layer defining a pixel region, a light emitting layer, and a second electrode;
   coating a molybdenum thin film on the thin film encapsulation layer;
   coating a molybdenum oxide (MoOx) thin film on the molybdenum thin film;
   radiating laser light on the molybdenum oxide thin film overlapping the pixel region and oxidizing the molybdenum thin film overlapping the pixel region; and
   forming a metal pattern by wet etching the oxidized molybdenum thin film and the molybdenum oxide thin film.

2. The method of claim 1, wherein the forming of the metal pattern comprises wet etching the oxidized molybdenum thin film and the molybdenum oxide thin film utilizing water (H2O).

3. The method of claim 1, wherein the oxidized molybdenum thin film is MoOx and X is in a range of X>2.

4. The method of claim 1, further comprising forming a multi-layer thin film layer on the thin film encapsulation layer.

5. The method of claim 4, wherein the forming of the multi-layer thin film layer comprises alternately laminating at least one dielectric layer and at least one metal layer.

6. The method of claim 1, wherein the forming of the thin film encapsulation layer comprises alternately laminating at least one organic layer and at least one inorganic layer.

7. A method of manufacturing a display device, the method comprising:
   forming a thin film encapsulation layer on a substrate, the substrate comprising a first electrode, a pixel defining layer defining a pixel region, a light emitting layer, and a second electrode;
   coating a molybdenum thin film on the thin film encapsulation layer;

injecting oxygen (O2) into the molybdenum thin film overlapping the pixel region by ion implantation and oxidizing the molybdenum thin film overlapping the pixel region; and forming a metal pattern by wet etching the oxidized molybdenum thin film.

8. The method of claim 7, wherein the forming of the metal pattern comprises wet etching the oxidized molybdenum thin film utilizing water (H2O).

9. The method of claim 7, wherein the oxidized molybdenum thin film is MoOx and X is in a range of X>2.

10. The method of claim 7, further comprising forming a multi-layer thin film layer on the thin film encapsulation layer.

11. The method of claim 10, wherein the forming of the multi-layer thin film layer comprises alternately laminating at least one dielectric layer and at least one metal layer.

12. The method of claim 7, wherein the forming of the thin film encapsulation layer comprises alternately laminating at least one organic layer and at least one inorganic layer.

* * * * *